United States Patent
Bienczyk et al.

(10) Patent No.: US 12,557,206 B2
(45) Date of Patent: Feb. 17, 2026

(54) CONTROL CIRCUIT FOR DRIVERS, SWITCHING UNIT AND SYSTEM, POWER SUPPLY, AND PLASMA SYSTEM

(71) Applicant: TRUMPF Huettinger GmbH + Co. KG, Freiburg (DE)

(72) Inventors: Marcin Bienczyk, Krzywda (PL); Adam Grabowski, Plonsk (PL); Piotr Lach, Wolomin (PL); Krzysztof Gedroyc, Warsaw (PL); Michal Wysocki, Julianow (PL)

(73) Assignee: TRUMPF HUETTINGER GMBH + CO. KG, Freiburg (DE)

( * ) Notice: Subject to any disclaimer, the term of this patent is extended or adjusted under 35 U.S.C. 154(b) by 104 days.

(21) Appl. No.: 18/645,487

(22) Filed: Apr. 25, 2024

(65) Prior Publication Data
US 2024/0276629 A1    Aug. 15, 2024

Related U.S. Application Data

(63) Continuation of application No. PCT/EP2022/079262, filed on Oct. 20, 2022.

(30) Foreign Application Priority Data

Oct. 29, 2021    (DE) .................... 20 2021 105 937.0

(51) Int. Cl.
H05H 1/46    (2006.01)
H03K 17/687  (2006.01)

(52) U.S. Cl.
CPC ....... *H05H 1/4645* (2021.05); *H03K 17/6871* (2013.01)

(58) Field of Classification Search
None
See application file for complete search history.

(56) References Cited

U.S. PATENT DOCUMENTS

| | | | |
|---|---|---|---|
| 7,506,014 B2 | 3/2009 | Drummond | |
| 2002/0159276 A1* | 10/2002 | Deboy | H02M 3/33507 363/20 |

(Continued)

FOREIGN PATENT DOCUMENTS

| | | |
|---|---|---|
| DE | 102012216326 A1 | 3/2014 |
| DE | 102015002702 A1 | 9/2016 |

(Continued)

OTHER PUBLICATIONS

Braun, Weston D., et al., "MRI compatible dc modulator for an envelope tracking transmitter," In 2019 20th Workshop on Control and Modeling for Power Electronics (COMPEL), 2019, pp. 1-4. IEEE, Piscataway, NJ, USA.

(Continued)

*Primary Examiner* — Kenneth B Wells
(74) *Attorney, Agent, or Firm* — LEYDIG, VOIT & MAYER, LTD.

(57) ABSTRACT

A control circuit for at least two drivers is provided. Each of the two drivers is configured to switch on and off electrically driven switching elements that are electrically connected to each other. The control circuit includes a first parallel-to-serial-converter including a first parallel input port and a first serial output-port connectable to a first driver, a second parallel-to-serial-converter including a second parallel input port and a second serial output-port connectable to a second driver, and a processor unit configured to send a first data package stream to the first parallel input port, and send a second data package stream to the second parallel input port. Both the first data package stream and the second data package stream are configured to be converted to serial-data-streams at the first serial output-port and the second serial output-port, respectively. The serial data-streams are configured to control the at least two drivers.

16 Claims, 5 Drawing Sheets

LEGEND
1 control circuit
2 first parallel-to-serial-converter
3 second parallel-to-serial-converter
4 first parallel input port
5 second parallel input port
6 first serial output port
7 second serial output port
8 processor unit
9 system clock generator
10 first driver
11 second driver
12, 13 switching elements
14 data interface
15 memory

(56) References Cited

U.S. PATENT DOCUMENTS

| | | | |
|---|---|---|---|
| 2008/0088365 A1* | 4/2008 | Jang | G11C 7/02 |
| | | | 327/563 |
| 2009/0295341 A1 | 12/2009 | Nakamura et al. | |
| 2011/0158299 A1* | 6/2011 | Yamazaki | H03M 9/00 |
| | | | 375/295 |
| 2012/0008713 A1* | 1/2012 | Ebuchi | H03K 3/0322 |
| | | | 375/295 |
| 2014/0043083 A1 | 2/2014 | Hirayama | |
| 2015/0002117 A1 | 1/2015 | Labib et al. | |
| 2017/0250056 A1 | 8/2017 | Boswell et al. | |
| 2020/0106439 A1* | 4/2020 | Funabashi | H03K 19/00346 |
| 2020/0195274 A1* | 6/2020 | Kim | H03M 7/04 |

FOREIGN PATENT DOCUMENTS

| | | | |
|---|---|---|---|
| JP | 2009290961 A | 12/2009 | |
| JP | 2016523505 A | 8/2016 | |
| JP | 2017199649 A | 11/2017 | |

OTHER PUBLICATIONS

"High-Speed SerDes Interfaces in High Value FPGAs." Lattice Semiconductor Corporation, Lattice Semiconductor White Paper, 2009, Oregon, United States of America.

"SerDes". Wikipedia, 2019 [retrieved on Oct. 18, 2019]. Retreived from the Internet: <URL:https://en.wikipedia.org/w/index.php?title=SerDes&oldid=921855657>.

* cited by examiner

LEGEND
1 control circuit
2 first parallel-to-serial-converter
3 second parallel-to-serial-converter
4 first parallel input port
5 second parallel input port
6 first serial output port
7 second serial output port
8 processor unit
9 system clock generator
10 first driver
11 second driver
12, 13 switching elements
14 data interface
15 memory

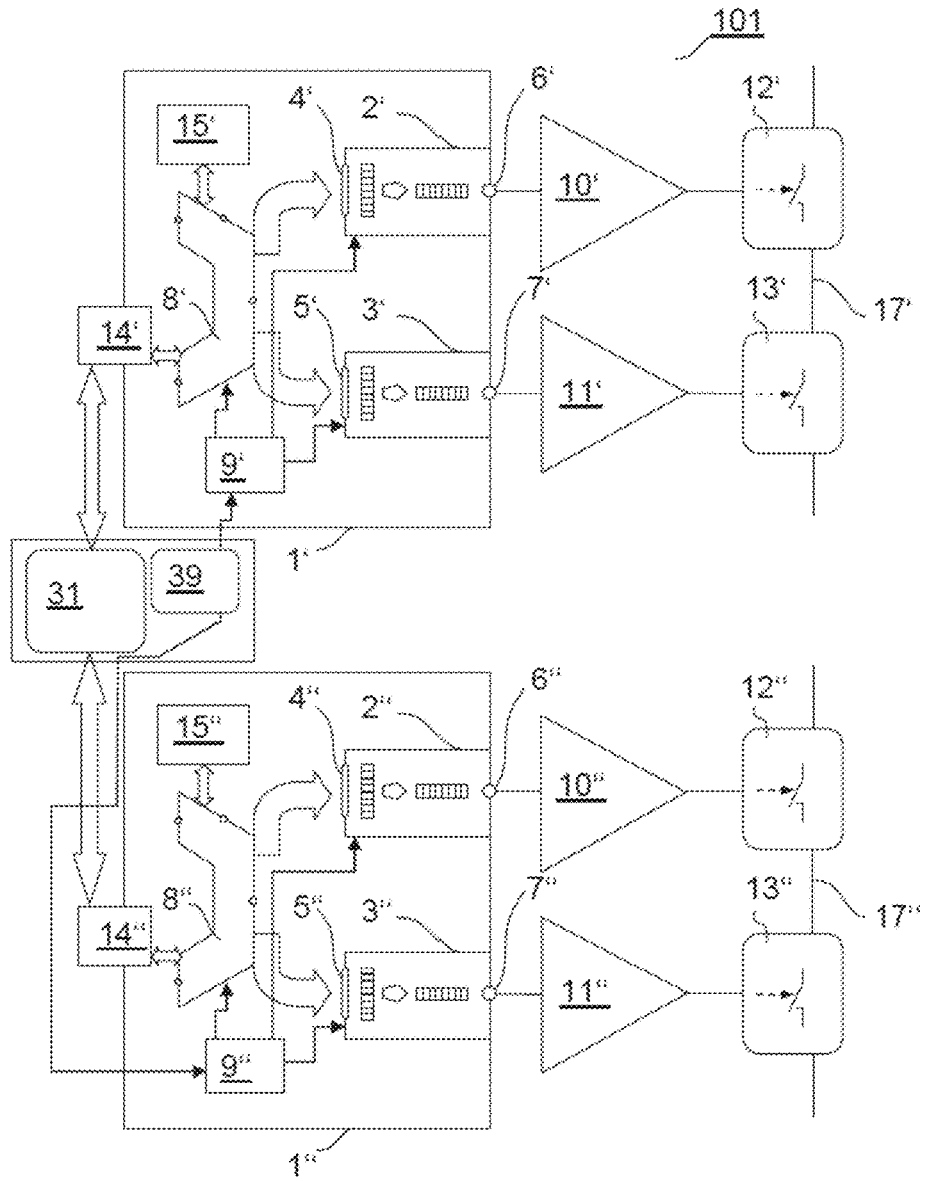

LEGEND
1, 1" control circuits
2', 2" first parallel-to-serial-converters
3', 3" second parallel-to-serial-converters
4', 4" first parallel input ports
5', 5" second parallel input ports
6', 6" first serial output ports
7', 7" second serial output ports
8', 8" processor units
9', 9" system clock generators
10', 10" first drivers
11', 11" second drivers
12', 12", 13', 13" switching elements
14', 14" data interfaces
15', 15" memories
31 external data processing device
39 external clock generator

Fig. 3

LEGEND
1 control circuit
2a, 2b, 2c additional parallel-to-serial-converters
3 second parallel-to-serial-converter
8 processor unit
8a arithmetic unit
8b processing unit
9 system clock generator
10 first driver
11 second driver
15 memory
31 external data processing device 41 parameter controller
42 sine data generator
43 DAC
44 filter
46 device
44 filter
46 device LEGEND
501 power supply system
502 impedance matching unit
503 plasma process unit
100 switching unit
101 switching system // CONTROL CIRCUIT FOR DRIVERS, SWITCHING UNIT AND SYSTEM, POWER SUPPLY, AND PLASMA SYSTEM

CROSS REFERENCE TO RELATED APPLICATIONS

This application is a continuation of International Application No. PCT/EP2022/079262 (WO 2023/072733 A1), filed on Oct. 20, 2022, and claims benefit to German Patent Application No. DE 2020 211 059 37.0, filed on Oct. 29, 2021. The aforementioned applications are hereby incorporated by reference herein.

FIELD

Embodiments of the present invention relate to a control circuit for at least two drivers, where the drivers are each configured to switch on and off electrically driven switching elements which are electrically connected to each other. Embodiments of the present invention also relate to a switching unit, a switching system, a power supply system, and plasma system.

BACKGROUND

When switching elements are connected to each other it is often very important to switch them on and off simultaneously. It is a challenge to drive the switching elements individually exactly in such a way that they are changing their on-off-resistance at the same time. In the case of high voltage switching very often serially connected switching elements are used. This switching elements should be switched on and off at the same time. If one switching element is late in switching on, it has to carry the full high voltage for which it is often not designed. It is a further challenge that switching elements do not always have the same delay time from getting a signal to switch on the switching element to the output of the switching element actually being switched on. So, switching elements need to be driven with an individual driving signal which should compensate the differences of different delay times.

This is also a challenge in power supplies with RF-output at high voltages. Such power supplies often work with switching elements. For example, in a switched push-pull amplifier or in a switched bridge amplifier the power transistors connected together need to be switched in an extremely synchronized manner.

SUMMARY

Embodiments of the present invention provide a control circuit for at least two drivers. Each of the two drivers is configured to switch on and off electrically driven switching elements that are electrically connected to each other. The control circuit includes a first parallel-to-serial-converter including a first parallel input port and a first serial output-port connectable to a first driver of the two drivers, a second parallel-to-serial-converter including a second parallel input port and a second serial output-port connectable to a second driver of the two drivers, and a processor unit configured to send a first data package stream to the first parallel input port, and send a second data package stream to the second parallel input port. Both the first data package stream and the second data package stream are configured to be converted to serial data streams at the first serial output-port and the second serial output-port, respectively. The serial data-streams are configured to control the at least two drivers.

BRIEF DESCRIPTION OF THE DRAWINGS

The subject matter of the present disclosure will be described in even greater detail below based on the exemplary figures. All features described and/or illustrated herein can be used alone or combined in different combinations. The features and advantages of various embodiments will become apparent by reading the following detailed description with reference to the attached drawings, which illustrate the following:

FIG. 3 illustrates a switching system with two control circuits according to embodiments of the invention;

DETAILED DESCRIPTION

Figure 1:
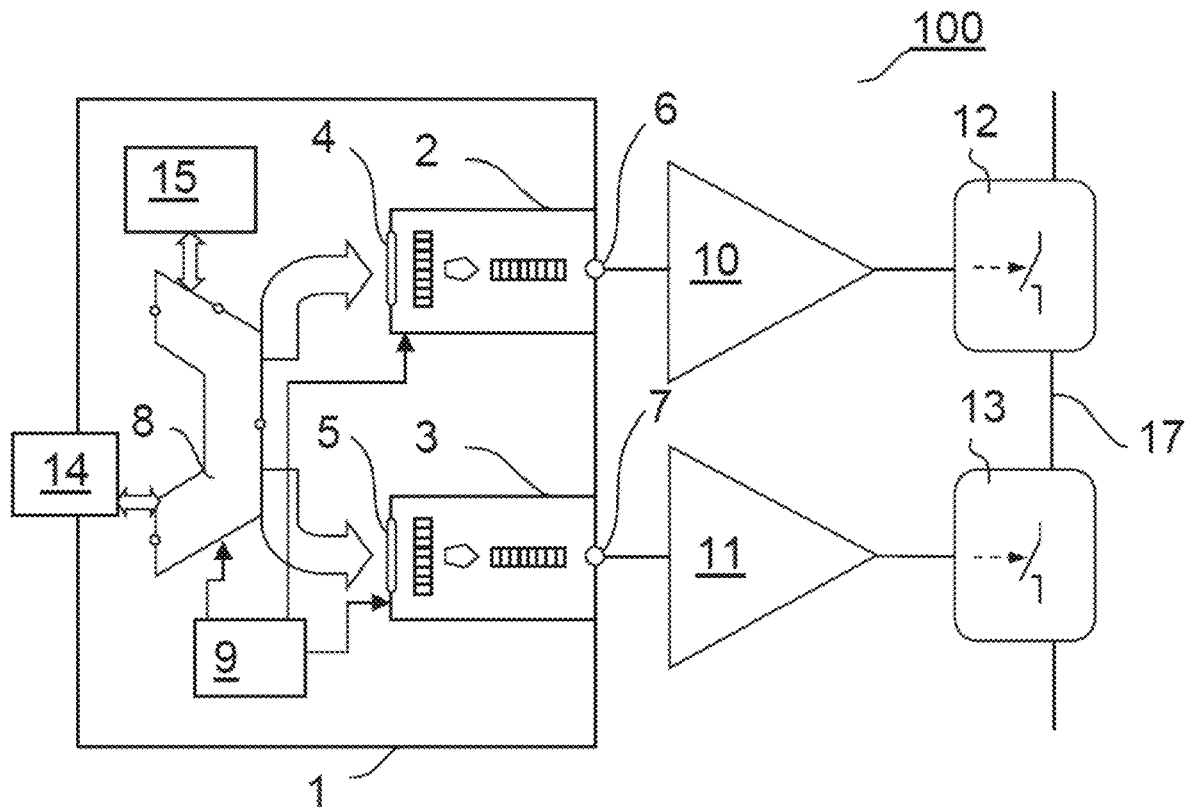
FIG. 1 illustrates a switching unit with a control circuit according to embodiments of the invention.

Embodiments of the present invention can enable generating pulses to switch on and off electrically driven switching elements in a precise, stable and repeatable manner.

In one aspect of the invention a control circuit for at least two drivers is provided, the drivers are each configured to switch on and off electrically driven switching elements which are electrically connected to each other, wherein the control circuit comprises:
  a first parallel-to-serial-converter comprising a first parallel input port and a first serial output-port connectable to a first driver,
  a second, in particular identical, parallel-to-serial-converter comprising a second parallel input port and a second serial output-port connectable to a second driver,
  a processor unit configured to
  send a first data package stream to the first parallel input port and
  send a second data package stream to the second parallel input port, where
  both package streams are configured to be converted, in particular by the parallel-to-serial-converter, to serial data streams at the output-ports and
  the serial data-streams are configured to control the drivers.

In a further aspect of the invention the control circuit may comprise or is built as a logical programmable unit, in particular a field programmable gate array (FPGA). The logical programmable unit, in particular the FPGA, may comprise the processor unit. The logical programmable unit, in particular the FPGA, may comprise the first and second parallel-to-serial-converter.

Embodiments of the invention are based on the use of gigabyte transceivers with built-in parallel-to-serial-converters built into the FPGA system, originally designed for fast communication. These transceivers and their parallel-to-serial-converters work at a very high frequency at their outputs on the order of one to several GHz. Processing such fast signals would be very difficult with standard integrated circuits. The transceivers built into the FPGA comprise these dedicated serializer blocks. Due to the high serialization factor, the frequency with which data need to be processed is significantly reduced. Appropriate FPGA software enables generating the desired control waveforms.

In a further aspect of the invention the control circuit may comprise a non-volatile memory with a computer readable program in this memory, the program executable by the processor unit, where the program is configured to force the processor unit to generate the first and second data package streams.

In a further aspect of the invention the control circuit may comprise a system clock generator configured to generate a system clock, where the frequency of the serial data streams at the output ports may be higher than the frequency of the system clock.

In a further aspect of the invention the control circuit may be configured to adjust time parameters such as phase, pulse width, frequency and dead time of the electrically driven switching elements.

The time parameters such as phase, pulse width, frequency and dead time may be driven within time intervals which are smaller than the time interval of the system clock, in particular 2 times or more than 2 times smaller, in particular 4 times or more than 4 times smaller, in particular 8 times or more than 8 times smaller, in particular 16 times or more than 16 times smaller, in particular 32 times or more than 32 times smaller, in particular 64 times or more than 64 times smaller.

In a further aspect of the invention the control circuit may comprise a built-in transceiver. This built-in transceiver may comprise one of the parallel-to-serial-converters.

In a further aspect of the invention the control circuit may comprise a built-in serializer-deserializer unit which is preferably built in the transceiver. This built-in serializer-deserializer unit may comprise one of the parallel-to-serial-converters.

In a further aspect of the invention the control circuit may comprise multiple transceivers and/or multiple serializer-deserializers.

In a further aspect of the invention the multiple transceivers and/or multiple serializer-deserializers may be clocked by the same system clock.

In a further aspect of the invention the first and second data package streams may be configured such that the electrically driven switching elements are synchronized at their outputs.

In a further aspect of the invention the control circuit may comprise a data interface configured to get data from an external data processing device.

In a further aspect of the invention a switching unit may comprise at least two electrically driven switching elements, and
at least two drivers, wherein the drivers are each configured to switch on and off the electrically driven switching elements which are electrically connected to each other, and
a control circuit as described in this disclosure.

In a further aspect of the invention the switching unit may comprise at least two control circuits as described in this disclosure, in particular drivable or driven by one identical system clock.

In a further aspect of the invention the switching system may comprise a switching unit as described in this disclosure and an external data processing device.

In a further aspect of the invention the switching system may comprise a switching unit as described in this disclosure and an external clock generator.

In FIG. 1 is shown a switching unit 100 comprising at least two electrically driven switching elements 12, 13 and at least two drivers 10, 11, the drivers are each configured to switch on and off the electrically driven switching elements 12, 13 which are electrically connected to each other with a connection 17.

The switching elements may be transistors, in particular MOSFETs. They may be built as VMOS or LDMOS transistors. They may be built as Si-based transistors or SiC-, or GaN-based transistors to be able to switch high power and high voltage.

The switching unit 100 further comprises a control circuit 1. The control circuit 1 comprises a first parallel-to-serial-converter 2 and a second parallel-to-serial-converter 3.

The first parallel to serial converter 2 comprises a first parallel input port 4 and a first serial output-port 6 connectable to a first driver 10. The second parallel-to-serial-converter 3 comprises a second parallel input port 5 and a second serial output-port 7 connectable to a second driver 11.

The control circuit 1 further comprises a processor unit 8. The processor unit 8 may be configured to send a first data package stream 21 (example shown in FIG. 2) to the first parallel input port 4 and send a second data package stream 22 to the second parallel input port 5.

Both package streams 21, 22 are configured to be converted by both parallel-to-serial-converters 2, 3 to serial data streams 23, 24 at the output ports 6, 7. The serial data-streams 23, 24 are configured to control the drivers 10, 11.

The control circuit 1 comprises a non-volatile memory 15. This memory 15 may comprise a computer readable program. The program may be executable by the processor unit 8. The program is configured to force the processor unit 8 to generate the first and second data package streams 21, 22.

The control circuit further comprises a system clock generator 9. This system clock generator 9 may be configured to generate a system clock 29. The frequency of the serial data streams 23, 24 at the output ports 6, 7 may be higher than the frequency of the system clock 29. In particular, the time shift of the serial data streams 23, 24 at the output ports 6, 7 may be in shorter time intervals than the frequency of the system clock 29, in particular 2 times or more than 2 times shorter, in particular 4 times or more than 4 times shorter, in particular 8 times or more than 8 times shorter, in particular 16 times or more than 16 times shorter, in particular 32 times or more than 32 times shorter, in particular 64 times or more than 64 times shorter.

Figure 4:
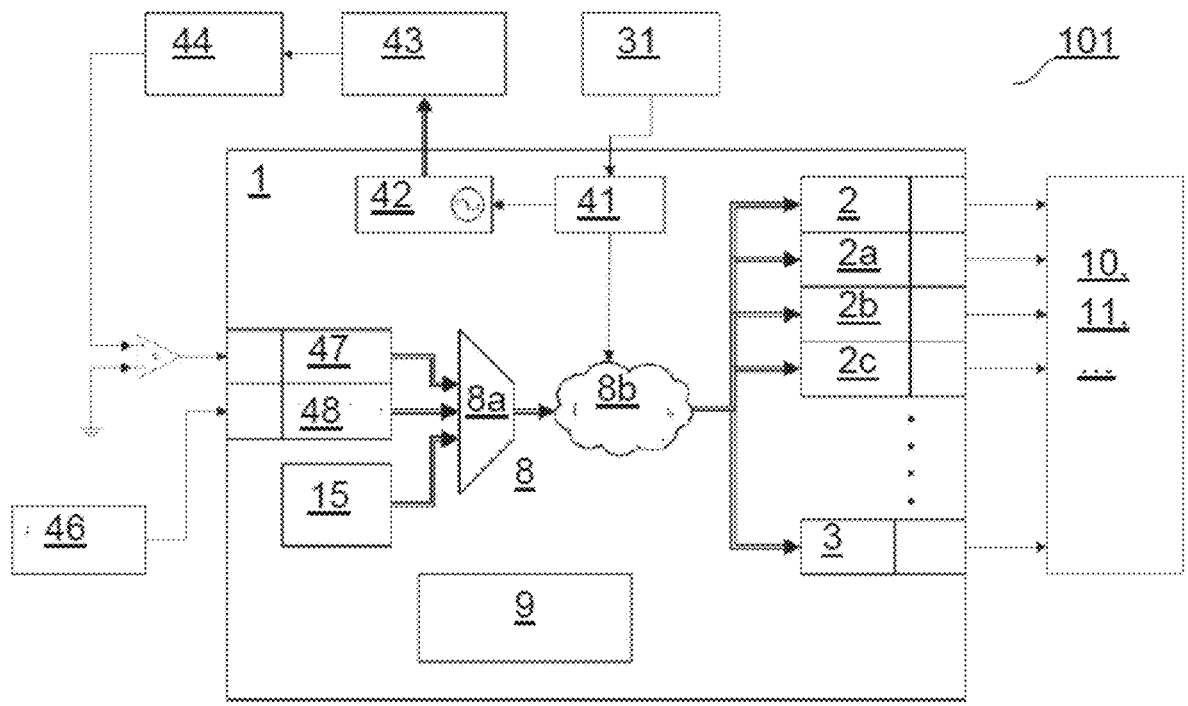
FIG. 4 shows a more detailed view of a switching system according to some embodiments.

The control circuit 1 comprises a data interface 14 configured to get data from an external data processing device 31 (shown in FIGS. 3 and 4).

To generate the control waveforms, a FPGA system was used, equipped with built-in gigabyte transceivers enabling sending and receiving data at a very high frequency. Such a transceiver has in its architecture a serializer, also called parallel-to-serial-converter 2, 3, and deserializer with adjustable data package length. The deserializer may be unused in this configuration. Most systems currently available on the market have a maximum serialization factor of 64. For correct operation, a serializer operating at a certain frequency needs to provide input data at a frequency reduced by a serialization factor, for example: if the serializer operating frequency is 5 GHz and serialization factor is 64 the system clock needs only to be 5000 MHz/64=78,125 MHz. This allows data to be processed at a much lower frequency than the output signal is generated. By clocking multiple transceivers from the same system clock 29 and starting the serialization process at the same time, synchronization between multiple outputs is ensured. By providing the appropriate data on the serializer, one can get the desired signal at the output. The data source can be a software data generator or one of the deserializer inputs working with the same clock. The signal source for the receiver can be a signal from a digital-to-analog converter to which samples are generated inside the FPGA system or from another independent device. The external reference signal applied to many FPGAs allows easy synchronization between signals generated by many FPGAs. The choice of reference data source can be selected at any time. In order to obtain the set parameters of the output signals such as filling, phase shift and dead time, the data before feeding to the serializer should be properly processed. The processing involves changing the value of '1' to '0' or '0' to '1' in subsequent data packages of data from the source of the pattern. Data packages can also be rewritten by the appropriate number of registers by the desired value. In this way, one may shift the signal in time and extend or shorten the pulse duration for each output signal independently.

Figure 2:
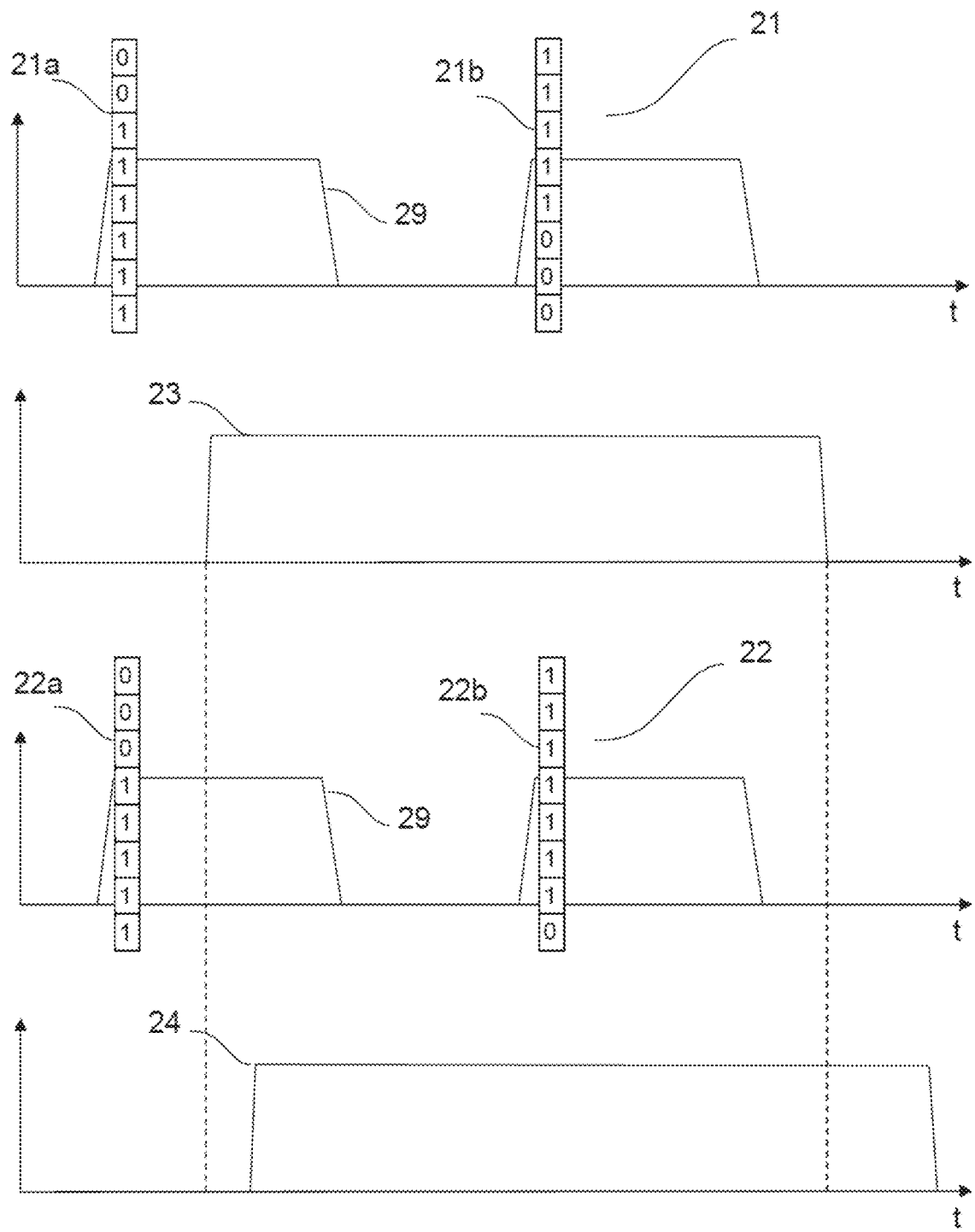
FIG. 2 illustrates time diagrams comprising data package streams according to some embodiments.

In FIG. 2 this is shown in one example. In the first time diagram the system clock 29 is shown. With each rising edge of the system clock a data package stream 21 is written into the parallel-to-serial-converter 2. Here are shown two different data package streams 21a and 21b:
data package stream 21a with 0 0 1 1 1 1 1 1; and
data package stream 21b with 1 1 1 1 1 0 0 0.

These data package streams 21a, 21b are serialized by the parallel-to-serial-converter 2 to the converted serial data stream 23, which is shown in FIG. 2 second diagram.

In the third diagram again the same system clock 29 is shown. With each rising edge of the system clock a data package stream 22 is written into the parallel-to-serial-converter 3. Here are shown two different data package streams 22a and 22b:
data package stream 22a with 0 0 0 1 1 1 1 1; and
data package stream 22b with 1 1 1 1 1 1 1 0.

These data package streams 22a, 22b are serialized by the parallel-to-serial-converter 3 to the converted serial data stream 24, which is shown in FIG. 2 fourth diagram.

Data package stream 22a is different from data package stream 21a.

Data package stream 22b is different from data package stream 21b.

Therefore the converted serial data stream 24 is different from the converted serial data stream 23, which can be seen with the dotted lines from the second to the fourth diagram.

So, in this example, the rising edge of the serial data stream 24 is delayed by one time interval and the falling edge serial data stream 24 is delayed by two time intervals. These time intervals are much smaller than the system clock 29. A very accurate driver signal may be generated in this way.

In FIG. 3 is shown a switching system 101 with two control circuits 1' and 1". All reference numbers of FIG. 1 are used here with additional apostrophes and have the same meaning, respectively.

The switching system 101 comprises two switching units 100', 100" as described in this document and an external data processing device 31. The external data processing device 31 may exchange data via the data interfaces 14', 14".

The system clock generators 9', 9" are here externally triggered by an external clock generator 39.

In FIG. 4 is shown a more detailed view of a switching system 101 with a control circuit 1, which may be a FPGA. All reference numbers of FIG. 1 are used here and have the same meaning, respectively. The processor unit 8 is here shown in two parts with an arithmetic unit 8a and a processing unit 8b. The control circuit 1 of this example comprises more than two of the parallel-to-serial-converters 2, 3 which is shown by several additional parallel-to-serial-converters 2a, 2b, 2c.

The control circuit 1 of this example further comprises a parameter controller 41. With such a parameter controller 41 it is possible to receive parameter values from the CPU and assign them to appropriate processing functions.

The control circuit 1 of this example further comprises a sine data generator 42. With such a data generator 42 it is possible to generate reference signal samples at a selected frequency.

The switching system 101 of this example further comprises a Digital-to-Analog Converter (DAC) 43 connected to the sine data generator 42. With such a DAC 43 it is possible to convert a digital signal to an analog signal. The generated analog signal may be used as a reference source in particular after filtering out the unwanted spectrum harmonics of the analog signal.

The switching system 101 of this example further comprises a filter 44 connected to the output of the Digital-to-Analog Converter 43 in order to suppress unwanted harmonics of the signal to form a precise sine signal.

This sine signal is input to a comparator 44 which generates a rectangular, digital signal. This signal is leaded to a deserializer 47 in the control circuit 1.

The control circuit 1 of this example further comprises a second deserializer 48 for signals coming from another device 46. With such a device 46 it is possible to add synchronization to a further device instead of an analog reference signal.

Embodiments of the invention may be implemented using FPGA with built-in transceivers capable of operating at a maximum frequency of 17 GHz. Due to the desired resolution of output parameters adjustment, the parallel-to-serial-converters may be clocked at 10 GHz, which gives a resolution of 100 ps. With a serialization factor of 64, the frequency of processing and delivering data to the serializer may be then at about 156.25 MHz, which may be then also the frequency of the system clock 29. The FPGA may be connected to the external data processing device 31 (computer) to allow easy parameter setting from the computer's software. The processing algorithm in the FPGA gets parameter settings from the CPU and then modifies the input reference data for each output independently. The reference data source is selected between software data generator and signals from two deserializers 47, 48 where receivers are connected to an external junction (for other devices) and compared with digital to analog converter 43. Source data for digital to analog converter 43 may be in the FPGA software.

Figure 5:
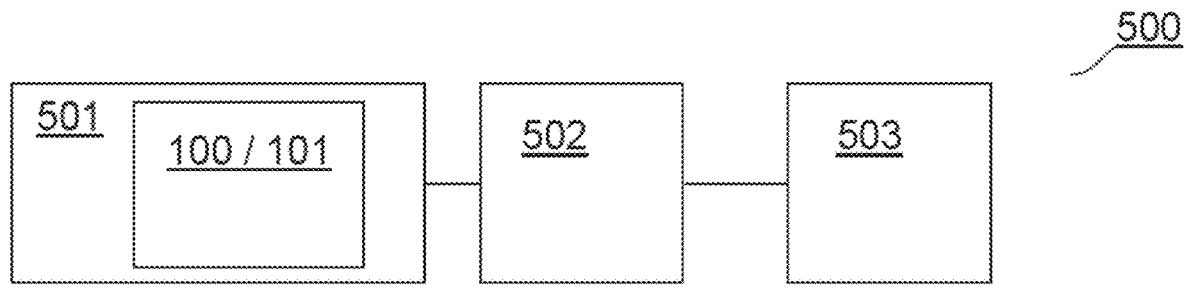
FIG. 5 illustrates a plasma system with a power supply system comprising a switching system according to some embodiments.

In FIG. 5 is shown a plasma system 500 comprising a power supply system 501 and a plasma process unit 503. The power supply system 501 may be a power supply system with an RF output signal to supply power with more than 1 kW and frequencies higher than 1 MHz to the plasma process unit 503. The plasma process unit 503 may be used for deposition, etching or treating atomic layers in processes like semiconductor manufacturing or glass coating or display manufacturing. Between the power supply system 501 and a plasma process unit 503 an optional impedance matching unit 502 may be placed and connected in order to match the output impedance of the power supply system 501 to the input impedance of the plasma process unit 503. The power supply system 501 comprises an aforementioned switching unit 100 and/or a switching system 101. Such a switching unit 100 and/or a switching system 101 may be used in an extremely advantageous way in such a plasma system 500.

While subject matter of the present disclosure has been illustrated and described in detail in the drawings and foregoing description, such illustration and description are to be considered illustrative or exemplary and not restrictive. Any statement made herein characterizing the invention is also to be considered illustrative or exemplary and not restrictive as the invention is defined by the claims. It will be understood that changes and modifications may be made, by those of ordinary skill in the art, within the scope of the following claims, which may include any combination of features from different embodiments described above.

The terms used in the claims should be construed to have the broadest reasonable interpretation consistent with the foregoing description. For example, the use of the article "a" or "the" in introducing an element should not be interpreted as being exclusive of a plurality of elements. Likewise, the recitation of "or" should be interpreted as being inclusive, such that the recitation of "A or B" is not exclusive of "A and B," unless it is clear from the context or the foregoing description that only one of A and B is intended. Further, the recitation of "at least one of A, B and C" should be interpreted as one or more of a group of elements consisting of A, B and C, and should not be interpreted as requiring at least one of each of the listed elements A, B and C, regardless of whether A, B and C are related as categories or otherwise. Moreover, the recitation of "A, B and/or C" or "at least one of A, B or C" should be interpreted as including any singular entity from the listed elements, e.g., A, any subset from the listed elements, e.g., A and B, or the entire list of elements A, B and C.

The invention claimed is:

1. A control circuit for at least two drivers, each of the two drivers is configured to switch on and off electrically driven switching elements that are electrically connected to each other, the control circuit comprising:
    a first parallel-to-serial-converter comprising a first parallel input port and a first serial output port connectable to a first driver of the two drivers;
    a second parallel-to-serial-converter comprising a second parallel input port and a second serial output port connectable to a second driver of the two drivers;
    a processor unit configured to:
        send a first data package stream to the first parallel input port, and
        send a second data package stream to the second parallel input port; and
    a built-in transceiver,
    wherein both the first data package stream and the second data package stream are configured to be converted to serial data streams at the first serial output port and the second serial output port, respectively, and
    wherein the serial data streams are configured to control the at least two drivers.

2. The control circuit of claim 1, wherein the control circuit is a logical programmable unit.

3. The control circuit of claim 1, further comprising a non-volatile memory with a computer readable program stored thereon, the program executable by the processor unit, wherein the program is configured to cause the processor unit to generate the first data package stream and the second data package stream.

4. The control circuit of claim 1, further comprising a system clock generator configured to generate a system clock, where a frequency of the serial data streams at the first serial output-port and the second serial output port is higher than a frequency of the system clock.

5. The control circuit of claim 1, wherein the control circuit is configured to adjust time parameters of the electrically driven switching elements, the time parameters comprising at least one of a phase, a pulse width, a frequency, or a dead time.

6. The control circuit of claim 1, further comprising a built-in serializer-deserializer unit built in the transceiver.

7. The control circuit of claim 1, comprising multiple transceivers and/or multiple serializer-deserializers.

8. The control circuit of claim 7, wherein the multiple transceivers and/or the multiple serializer-deserializers are clocked by the same system clock.

9. The control circuit of claim 1, wherein the first data package stream and the second data package stream are configured such that the electrically driven switching elements are synchronized at outputs thereof.

10. The control circuit of claim 1, further comprising a control unit, wherein the control unit comprises a data interface configured to get data from an external data processing device.

11. A switching unit comprising:
    at least two electrically driven switching elements;
    at least two drivers, wherein each of the at least two drivers is configured to switch on and off the at least two electrically driven switching elements that are electrically connected to each other; and
    at least one control circuit for the at least two drivers, the at least one control circuit comprising:
        a first parallel-to-serial-converter comprising a first parallel input port and a first serial output port connectable to a first driver of the at least two drivers;
        a second parallel-to-serial-converter comprising a second parallel input port and a second serial output port connectable to a second driver of the at least two drivers;
        a processor unit configured to:
            send a first data package stream to the first parallel input port, and
            send a second data package stream to the second parallel input port; and
        a built-in transceiver,
        wherein both the first data package stream and the second data package stream are configured to be converted to serial data streams at the first serial output port and the second serial output port, respectively, and
        wherein the serial data streams are configured to control the at least two drivers.

12. The switching unit of claim 11, wherein the at least one control circuit comprises at least two control circuits drivable or driven by the same system clock.

13. A switching system, comprising the switching unit according to claim 11, and
an external data processing device.

14. The switching system of claim 13 further comprising an external clock generator.

15. A power supply system comprising the switching system according to claim 13.

16. A plasma system comprising the power supply system according to claim 15 and a plasma process unit.

* * * * *